(12) United States Patent
Ishiwata

(10) Patent No.: US 10,079,216 B2
(45) Date of Patent: Sep. 18, 2018

(54) CIRCUIT BOARD WITH MEASURE AGAINST HIGH FREQUENCY NOISE

(71) Applicant: Murata Manufacturing Co., Ltd., Kyoto-fu (JP)

(72) Inventor: Yu Ishiwata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/480,421

(22) Filed: Apr. 6, 2017

(65) Prior Publication Data

US 2017/0323861 A1   Nov. 9, 2017

(30) Foreign Application Priority Data

May 6, 2016 (JP) .................. 2016-093253

(51) Int. Cl.
| | |
|---|---|
| *H01L 23/58* | (2006.01) |
| *H01L 23/66* | (2006.01) |
| *H01L 49/02* | (2006.01) |
| *H01L 23/498* | (2006.01) |

(52) U.S. Cl.
CPC ........ *H01L 23/66* (2013.01); *H01L 23/49838* (2013.01); *H01L 28/10* (2013.01); *H01L 2223/6611* (2013.01); *H01L 2223/6661* (2013.01)

(58) Field of Classification Search
CPC . H01L 23/66; H01L 23/49838; H01L 23/645; H01L 28/10; H01L 2223/6611; H01L 2223/6616; H01L 2223/6661; H01L 21/4853; H01L 21/4825
See application file for complete search history.

(56) References Cited

U.S. PATENT DOCUMENTS

| | | | |
|---|---|---|---|
| 2004/0069969 A1* | 4/2004 | Endo ................. | B32B 18/00 252/62.63 |
| 2006/0110859 A1* | 5/2006 | Shigemura .......... | H01L 23/3121 438/125 |
| 2006/0163693 A1* | 7/2006 | Mutoh .................. | H01L 23/66 257/531 |

FOREIGN PATENT DOCUMENTS

| | | |
|---|---|---|
| JP | 61-066911 U | 5/1986 |
| JP | 10-163027 A | 6/1998 |

* cited by examiner

*Primary Examiner* — Yosef Gebreyesus
(74) *Attorney, Agent, or Firm* — Studebaker & Brackett PC

(57) ABSTRACT

A circuit board with a measure against high frequency noise includes: an interconnect substrate having an interconnect pattern to which an IC which is a source of high frequency noise is electrically connected; a pair of lands provided on a mounting surface of the interconnect substrate; and a chip component having a body composed of a magnetic body (i.e., ferrite) in a rectangular parallelepiped, and a pair of external electrodes provided at opposite ends of the body, the pair of external electrodes being connected to the pair of lands, the body being disposed on the interconnect pattern, as observed in a direction perpendicular to the mounting surface.

7 Claims, 6 Drawing Sheets

CIRCUIT BOARD WITH MEASURE AGAINST HIGH FREQUENCY NOISE

CROSS REFERENCE TO RELATED APPLICATIONS

This application claims benefit of priority to Japanese Patent Application 2016-093253 filed May 6, 2016, the entire content of which is incorporated herein by reference.

TECHNICAL FIELD

The present disclosure relates to a circuit board with a measure against high frequency noise.

BACKGROUND

In recent years, electronic devices such as mobile terminals represented by smart phones are increasingly developed to present high performance, multi-functionality, and the like, and accordingly, they are increasingly developed to be rapidly driven by a low voltage and a large current. As an electronic device is rapidly driven, in an electronic component such as an IC, a high frequency noise is generated by a switching device rapidly switching or the like. The noise has a negative effect on an operation of an electronic device, and accordingly, an anti-noise measure is required.

For example, Japanese Patent Laying-Open No. 10-163027 discloses an inductance element comprising a printed pattern laid on a printed circuit board and a magnetic body stuck in a vicinity of the printed pattern wherein the magnetic body can be partially cut and thus adjusted in a direction to reduce the printed pattern's inductance to adjust inductance successively with good precision. Japanese Patent Laying-Open No. 10-163027 discloses that by applying this inductance element to an electronic circuit, a low pass filter with good adjustment precision is obtained.

Furthermore, Japanese Utility Model Laying-open No. 61-66911 discloses a multilayer type bead chip inductor in which a conductor is disposed inside a ferrite sheet. Furthermore, as a measure against high frequency noise, there is also a measure using an inductor in the form of a multilayer coil for high frequency.

SUMMARY

The inductance element disclosed in Japanese Patent Laying-Open No. 10-163027 requires sticking the magnetic body to the printed circuit board in order to finely adjust inductance. Sticking such a component with a measure against noise to a substrate must be done manually for example. This reduces mountability to the substrate.

Furthermore, the multilayer type bead chip inductor disclosed in Japanese Utility Model Laying-open No. 61-66911 has a pattern formed of a conductor inside ferrite. When such a component provided with a pattern inside is used to take a measure against noise, a stray capacitance is generated between the component's internal pattern and an external electrode, between patterns, and/or the like, and this stray capacitance reduces high frequency characteristics against noise. Accordingly, there is a possibility that conduction of a noise of a high frequency band (e.g., a frequency band of 10 GHz or more) cannot be suppressed.

Furthermore, when the above described high frequency inductor is used to take a measure against high frequency noise, the measure can suppress conduction of the noise, however, the inductor may reflect the noise. The reflected noise is radiated secondarily and has a negative effect on the surrounding components.

The present disclosure has been made in order to resolve the above problem, and contemplates a circuit board with a measure against high frequency noise which is excellent in mountability and can suppress conduction and reflection of a high frequency noise.

The circuit board with a measure against high frequency noise according to the present disclosure is such that when a noise (a current) flows through an interconnect pattern, a magnetic field is generated around the interconnect pattern, and a chip component (a body) composed of a magnetic body and disposed on the interconnect pattern allows the magnetic body to absorb the magnetic field's energy. This can suppress conduction of a noise in the interconnect pattern and also suppress reflection of the noise at the chip component. In particular, the chip component does not have a conductor pattern formed inside the body composed of the magnetic body, and stray capacitance is not generated between the conductor pattern and an external electrode. Accordingly, the circuit board with a measure against high frequency noise according to the present disclosure is excellent in high frequency characteristics (e.g., a transmission characteristic and a reflection characteristic) against noise, and can suppress conduction and reflection of a noise in a high frequency band. Furthermore, in the circuit board with a measure against high frequency noise according to the present disclosure, a pair of lands is provided on a mounting surface of an interconnect substrate and a pair of external electrodes is provided to the chip component, and the chip component can be mounted using a mounting machine used for mounting another chip component mounted on the interconnect substrate. Thus the circuit board with a measure against high frequency noise according to the present disclosure is excellent in mountability and can suppress conduction and reflection of a high frequency noise.

Preferably, in the circuit board with a measure against high frequency noise according to the present disclosure, the magnetic body is ferrite. By using ferrite, an absorptance of a magnetic field's energy generated by a high frequency noise is high.

Preferably, in the circuit board with a measure against high frequency noise according to the present disclosure, the ferrite is hexagonal ferrite. Hexagonal ferrite never has magnetic permeability decreased in a high frequency band. When hexagonal ferrite is compared with a different ferrite, the former allows a noise to be absorbed in a larger amount and a noise of a high frequency to be also absorbed.

Preferably, in the circuit board with a measure against high frequency noise according to the present disclosure, the interconnect pattern is provided on the mounting surface, and the body is disposed at a location covering a portion of the interconnect pattern. By such a configuration, by the body (the magnetic body) of the chip component disposed immediately adjacent to the interconnect pattern, a magnetic field's energy generated by a high frequency noise conducting through the interconnect pattern can be efficiently absorbed.

Preferably, in the circuit board with a measure against high frequency noise according to the present disclosure, the interconnect substrate is a multilayer interconnect substrate, the interconnect pattern is provided in an interior of the interconnect substrate, and the body is disposed over the interconnect pattern provided in the interior. By such a configuration, by the body (the magnetic body) of the chip component, a magnetic field's energy generated by a high frequency noise conducting through the interconnect pattern provided inside the substrate can be absorbed, and the high frequency noise's conduction and reflection at the interconnect pattern provided inside the substrate can be suppressed.

Preferably, in the circuit board with a measure against high frequency noise according to the present disclosure, the lands are not connected to the interconnect pattern. Thus, a magnetic field caused by a high frequency noise conducting through the interconnect pattern is not interrupted by the lands (a metal object), and an absorptance of the magnetic field's energy at the chip component is high.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 5A is a plan view and FIG. 5B is a cross section taken along a line III-III shown in FIG. 5A.

FIG. 6A is a plan view and FIG. 6B is a cross section taken along a line IV-IV shown in FIG. 6A.

DETAILED DESCRIPTION

Hereafter, reference will be made to the drawings to describe suitable embodiments of the present disclosure. In the figures, identical or corresponding components are identically denoted. Furthermore, in each figure, identical elements are identically denoted and will not be described repeatedly.

Figure 1:
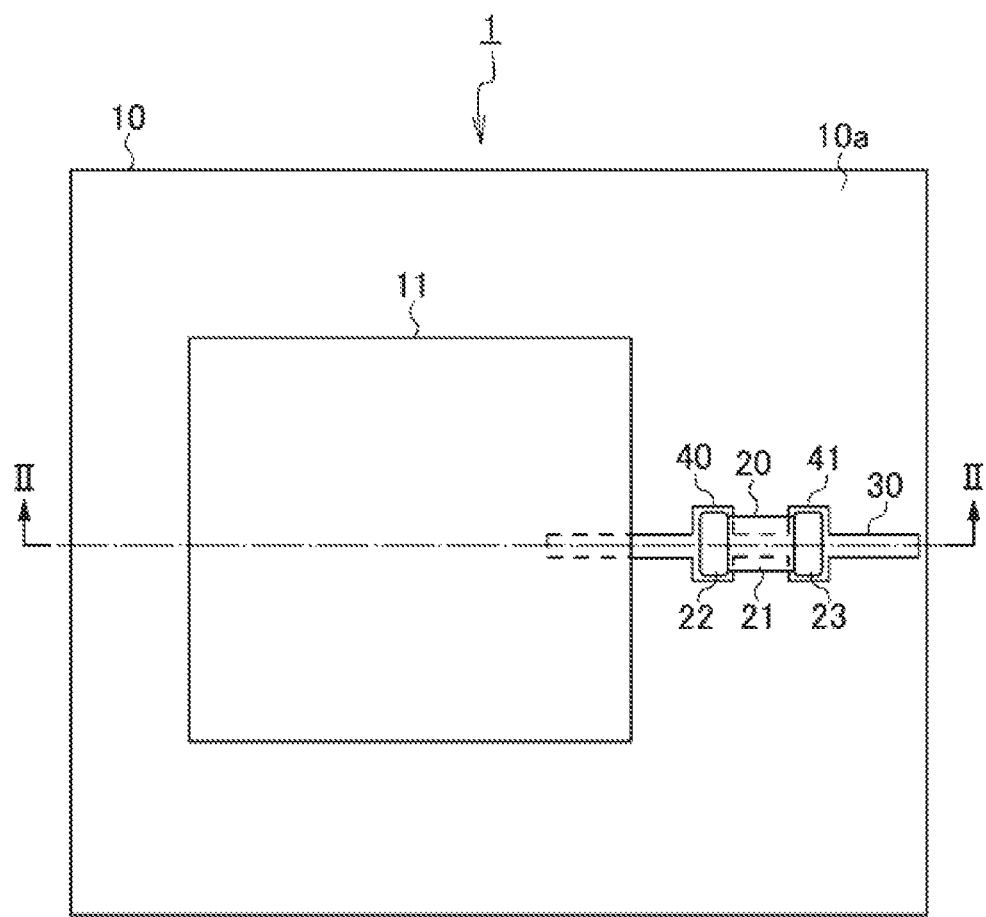
FIG. 1 is a plan view of a configuration of a circuit board with a measure against high frequency noise according to an embodiment.
Figure 2:
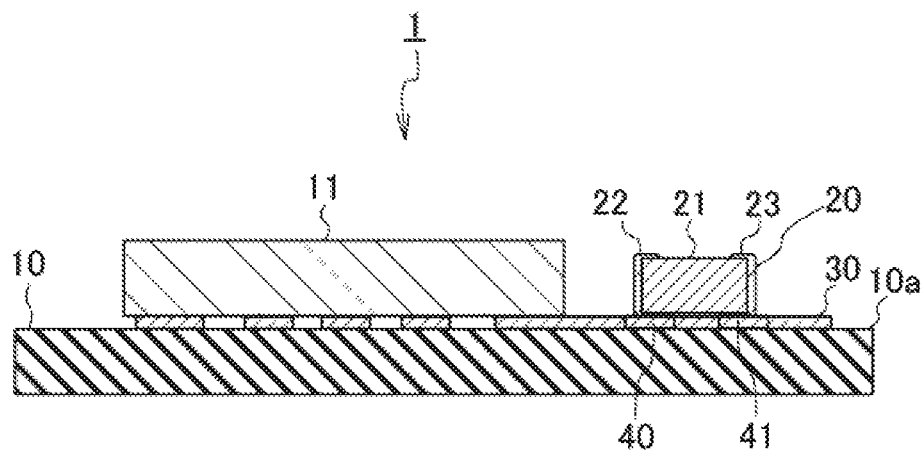
FIG. 2 is a cross section taken along a line II-II shown in FIG. 1.

With reference to FIG. 1 and FIG. 2, a circuit board 1 with a measure against high frequency noise according to an embodiment will be described. FIG. 1 is a plan view showing a configuration of circuit board 1 with a measure against high frequency noise according to an embodiment. FIG. 2 is a cross section taken along a line II-II shown in FIG. 1.

Circuit board 1 with a measure against high frequency noise is a circuit which suppresses conduction and reflection of a noise of a high frequency band (a high frequency noise). In the embodiment, a high frequency band of a noise to be suppressed is a frequency band of 10 GHz or more. Circuit board 1 with a measure against high frequency noise is configured on an interconnect substrate 10. Interconnect substrate 10 has a mounting surface 10a (an upper surface or a lower surface) on which electronic components such as an IC 11 (corresponding to the claimed integrated circuit) and a chip component 20 are surface-mounted. An interconnect pattern 30 is provided on mounting surface 10a of interconnect substrate 10. Interconnect substrate 10 is a multilayer interconnect substrate, for example. Note that FIGS. 1 and 2 only show IC 11 and chip component 20 mounted on interconnect substrate 10, and other electronic components such as a variety of types of chip components mounted on interconnect substrate 10 are not shown in the figures. Furthermore, FIG. 1 and FIG. 2 only show interconnect pattern 30 provided on interconnect substrate 10, and other patterns such as a ground pattern provided to interconnect substrate 10 are not shown in the figures.

IC 11 is mounted on mounting surface 10a. IC 11 is electrically connected to interconnect pattern 30. IC 11 is a CPU, a basebands IC, a PMIC (a power management IC (an IC which creates a power supply)), a memory, for example. In IC 11, a noise of a high frequency band is caused as a switching device is rapidly switched. The noise (a current) of the high frequency band generated in IC 11 flows to interconnect pattern 30 to which IC 11 is connected.

Chip component 20 is mounted on mounting surface 10a. Chip component 20 is a component with a measure against high frequency noise, and when it is observed on interconnect substrate 10 in a direction perpendicular to mounting surface 10a (in a plan view), it is disposed on a conduction path of high frequency noise (i.e., on interconnect pattern 30). Chip component 20 has a body 21 and a pair of external electrodes 22 and 23. Chip component 20 is generally a rectangular parallelepiped as well as another chip component mounted on interconnect substrate 10. Chip component 20 has a size similar to that of another chip component mounted on interconnect substrate 10, and it is for example 1.0 mm×0.5 mm×0.5 mm.

Body 21 is a rectangular parallelepiped. Body 21 is formed of a ferrite material. Ferrite is a ceramic which contains iron oxide as a major component and presents magnetism, and it is a type of a magnetic body. The ferrite includes a MnZn-based ferrite and a NiZn-based ferrite, for example. Depending on the type of ferrite used for body 21, a frequency band can be adjusted so that a noise to be suppressed can be absorbed. Furthermore, by increasing the size of body 21, an amount of a high frequency noise absorbed can be increased.

In particular, the ferrite used for body 21 is preferably hexagonal ferrite. Hexagonal ferrite is produced as a ferrite material such that a manner of arranging particles of molecules configuring a ferrite is changed into a hexagonal-type crystal structure. Hexagonal ferrite never has magnetic permeability decreased in a high frequency band. When this hexagonal ferrite is compared with a case where a ferrite of a different structure is used, the former allows a noise to be absorbed in a larger amount and a noise of a high frequency to be also absorbed.

The pair of external electrodes 22 and 23 is provided on body 21. One external electrode 22 is provided at one of the ends of body 21 opposite to each other in the longitudinal direction of body 21 (it is provided at at least an end surface and may be provided at a portion of a side surface, a portion of a main surface or the like). External electrode 23 is provided at the other of the ends of body 21 opposite to each other in the longitudinal direction of body 21. External electrodes 22 and 23 each have a Cu electrode and a plating layer (e.g., a nickel plating layer and a tin plating layer covering the nickel plating layer) formed to cover the Cu electrode, for example.

Interconnect pattern 30 is provided on mounting surface 10a of interconnect substrate 10. Interconnect pattern 30 is a power supply pattern, a signal pattern, or the like for example. Interconnect pattern 30 is a printed interconnect pattern composed of a copper foil or the like for example. IC 11 is electrically connected to interconnect pattern 30. Lands 40 and 41 are provided to interconnect pattern 30.

Lands 40 and 41 are lands provided on mounting surface 10a of interconnect substrate 10 for mounting chip component 20 on interconnect substrate 10. Lands 40 and 41 are preferably disposed at a location close to IC 11. Lands 40 and 41 are each disposed at a prescribed portion of interconnect pattern 30. A spacing of land 40 and land 41 is determined based on a spacing of external electrode 22 and external electrode 23 of chip component 20. Lands 40 and 41 are shaped and sized based on the shape, size and the like of external electrodes 22 and 23.

One external electrode 22 of chip component 20 is soldered or similarly bonded to one land 40 and thus connected thereto. Furthermore, the other external electrode 23 of chip component 20 is soldered or similarly bonded to the other land 41 and thus connected thereto. Thus, chip component 20 is mounted on interconnect substrate 10. When mounting chip component 20, the same mounting machine as that used to mount another chip component on interconnect substrate 10 is used. Chip component 20 (body 21) mounted on interconnect substrate 10 is disposed to cover a portion of interconnect pattern 30. Chip component 20 has a longitudinal direction generally parallel to the direction of interconnect pattern 30.

A function of chip component 20 mounted on interconnect substrate 10 will now be described. When a high frequency noise is generated in IC 11, the high frequency noise (a current) flows through interconnect pattern 30. When the high frequency noise (the current) flows through interconnect pattern 30, a magnetic field (a magnetic flux) is generated around interconnect pattern 30. On interconnect pattern 30, chip component 20 (body 21) composed of ferrite is disposed, and the magnetic field's energy is absorbed by the ferrite. This suppresses conduction of the high frequency noise in interconnect pattern 30 downstream of chip component 20. Furthermore, this suppresses reflection of the high frequency noise at chip component 20. Note that chip component 20 (body 21) covering a larger portion of interconnect pattern 30 allows more energy of the magnetic field to be absorbed.

In particular, inside body 21 of chip component 20, there is no conductor pattern (e.g., no coil pattern) formed. Accordingly, in chip component 20, no stray capacitance is generated between the conductor pattern and external electrodes 22 and 23. As a result, chip component 20 is excellent in characteristics (a transmission characteristic and a reflection characteristic) against noise in a high frequency band. Thus chip component 20 can suppress conduction of a noise of a high frequency band of 10 GHz or more and also suppress reflection of the noise.

Figure 3:
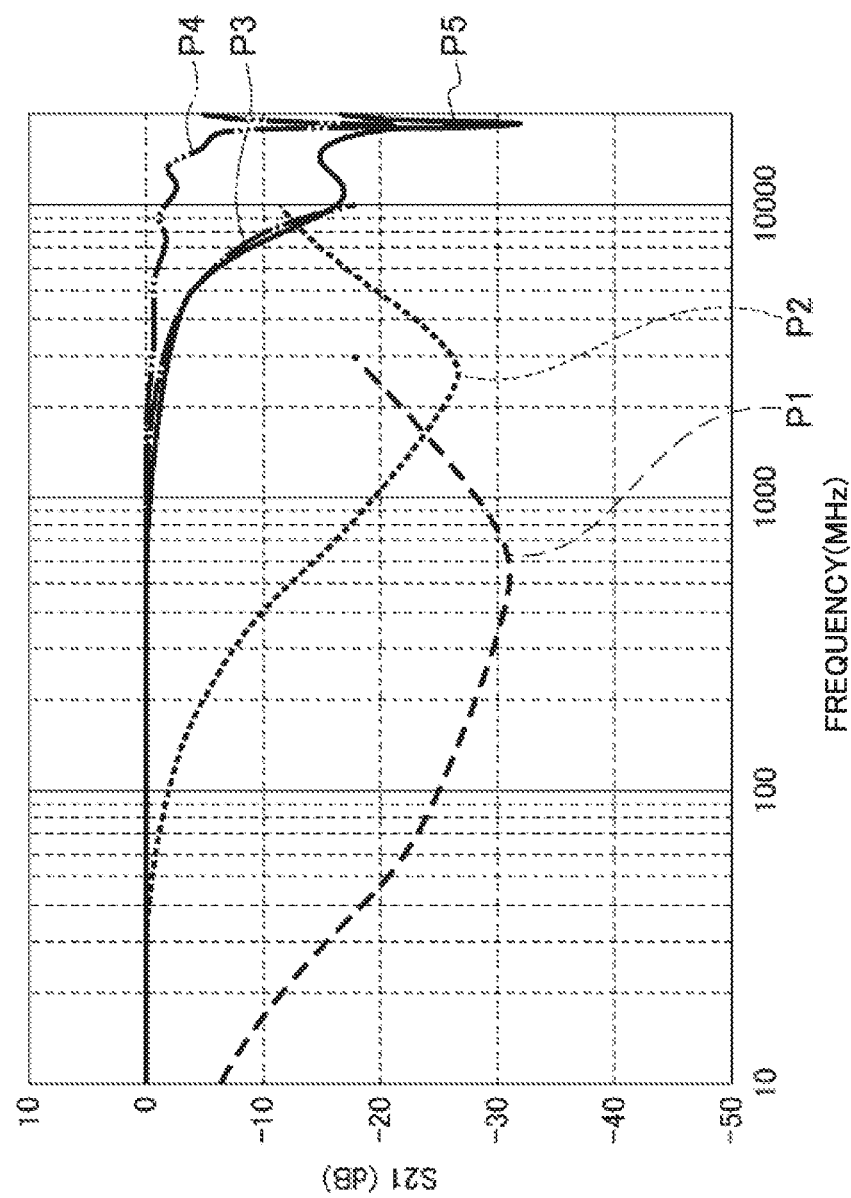
FIG. 3 shows a comparative example of a transmission characteristic against a noise conducting through an interconnect pattern.
Figure 4:
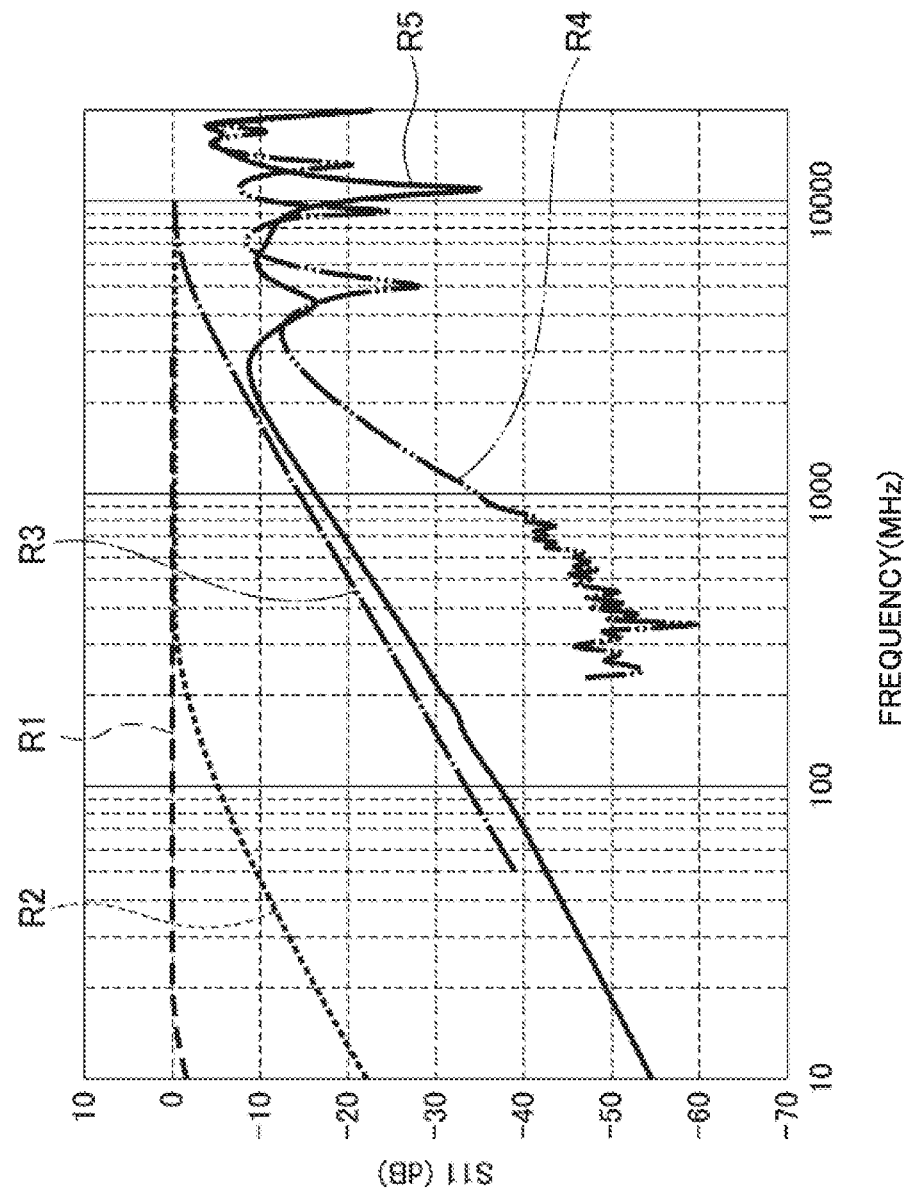
FIG. 4 shows a comparative example of a reflection characteristic against a noise conducting through the interconnect pattern.

With reference to FIG. 3 and FIG. 4, a comparative example of frequency characteristics (a transmission characteristic and a reflection characteristic) against a noise conducting through an interconnect pattern will be described. This comparative example compares a case where chip component 20 according to an embodiment is used as a component with a measure against noise, a case where a conventional component with a measure against noise is used, and a case where no component with a measure against noise is used. As the conventional component with a measure against noise are two types of chip ferrite beads (ferrite bead inductors formed in chips) and a chip inductor for high frequency. The frequency characteristics such as transmission and reflection are measured using a network analyzer, for example.

Initially, with reference to FIG. 3, a comparative example of a transmission characteristic against a noise conducting through an interconnect pattern will be described. FIG. 3 shows a comparative example of a transmission characteristic against a noise conducting through an interconnect pattern. In FIG. 3, the axis of abscissa represents a frequency (10 MHz or more), and an axis of ordinate represents S21 (a transmission coefficient). This S21 (a transmission coefficient) represents a transmission characteristic of a noise (a current) from an input end of the component with a measure against noise to an output end of the component with a measure against noise, and indicates that when it has a smaller value, noise is less easily transmitted. In FIG. 3, a graph indicated by a broken line (of long line segments) P1 represents a transmission characteristic when one chip ferrite bead is used, a graph indicated by a broken line (of short line segments) P2 represents a transmission characteristic when the other chip ferrite bead is used, a graph indicated by an alternate long and short dash line P3 represents a transmission characteristic when a chip inductor for high frequency is used, a graph indicated by a chain double-dashed line P4 represents a transmission characteristic when no component with a measure against noise is used, and a graph indicated by a solid line P5 represents a transmission characteristic when chip component 20 according to the embodiment is used.

When the chip ferrite beads are used, as indicated by transmission characteristics P1 and P2, in a frequency band of 10 GHz or more, a small S21 is not obtained, and a high frequency noise of 10 GHz or more is easily transmitted. When the chip inductor for high frequency is used, as indicated by transmission characteristic P3, in the frequency band of 10 GHz or more, a small S21 is not obtained, and a high frequency noise of 10 GHz or more is easily transmitted. When chip component 20 according to the embodiment is used, as indicated by transmission characteristic P5, in the frequency band of 10 GHz or more, S21 is small, and a high frequency noise of 10 GHz or more is not easily transmitted (an excellent transmission characteristic is presented against a noise of a high frequency band of 10 GHz or more). Note that when no component with a measure against noise is used, S21 is small in the frequency band of 10 GHz or more, however, it is larger than when chip component 20 according to the embodiment is used, and a transmission characteristic is presented in the high frequency band of 10 GHz or more which is inferior to that of chip component 20 according to the embodiment.

Reference will now be made to FIG. 4 to describe a comparative example of a reflection characteristic against a noise conducting through an interconnect pattern. FIG. 4 shows a comparative example of a reflection characteristic against a noise conducting through the interconnect pattern. In FIG. 4, the axis of abscissa represents a frequency (10 MHz or more), and an axis of ordinate represents S11 (a reflection coefficient). This S11 (the reflection coefficient) represents a reflection characteristic of a noise (a current) at the input end of the component with a measure against noise, and indicates that when it has a smaller value, noise is less easily reflected. In FIG. 4, a graph indicated by a broken line (of long line segments) R1 represents a reflection characteristic when one chip ferrite bead is used, a graph indicated by a broken line (of short line segments) R2 represents a reflection characteristic when the other chip ferrite bead is used, a graph indicated by an alternate long and short dash line R3 represents a reflection characteristic when the chip inductor for high frequency is used, a graph indicated by a chain double-dashed line R4 represents a reflection characteristic when no component with a measure against noise is used, and a graph indicated by a solid line R5 represents a reflection characteristic when chip component 20 is used.

When the chip ferrite beads are used, as indicated by reflection characteristics R1 and R2, S11 is large and noise is reflected. When the chip inductor for high frequency is used, as indicated by reflection characteristic R3, in the frequency band of 10 GHz or more, a small S11 is not obtained, and a high frequency noise of 10 GHz or more is easily reflected. When chip component 20 according to the embodiment is used, as indicated by reflection characteristic R5, in the frequency band of 10 GHz or more, S11 is small, and a high frequency noise of 10 GHz or more is not easily reflected (an excellent reflection characteristic is presented against a noise of a high frequency band of 10 GHz or more). Note that when no component with a measure against noise is used, S11 is small in the frequency band of 10 GHz or more, however, it is larger than when chip component 20 according to the embodiment is used, and a reflection characteristic is presented in the high frequency band of 10 GHz or more which is inferior to that of chip component 20 according to the embodiment.

As can also be seen from these transmission and reflection characteristics, when chip component 20 according to the embodiment is used, a high frequency noise of 10 GHz or more is not easily transmitted or reflected. This suppresses conduction of the high frequency noise in interconnect pattern 30 downstream of chip component 20. Furthermore, the high frequency noise is not easily reflected at chip component 20 upstream, and the high frequency noise's secondary radiation can also be suppressed.

Note that when chip component 20 according to the embodiment is used, as indicated by transmission characteristic P5 and reflection characteristic R5, in the frequency band of 10 GHz or more, there are frequencies for which S21 and S11 are significantly small. The frequencies are adjustable by the type of ferrite used in chip component 20 or the like.

According to circuit board 1 with a measure against high frequency noise according to the embodiment, by disposing chip component 20 (body 21) of ferrite on interconnect pattern 30, as observed in a direction perpendicular to mounting surface 10a, conduction and reflection of a high frequency noise at interconnect pattern 30 can be suppressed. Note that as chip component 20 does not have a conductor pattern formed inside body 21 of ferrite, no stray capacitance is generated between the conductor pattern and external electrodes 22 and 23, and chip component 20 is excellent in characteristics (a transmission characteristic and a reflection characteristic) against noise in a high frequency band.

According to circuit board 1 with a measure against high frequency noise according to the embodiment, as a pair of lands 40 and 41 are provided on mounting surface 10a and a pair of external electrodes 22 and 23 are provided to chip component 20, chip component 20 can be mounted using a mounting machine used for mounting another chip component mounted on interconnect substrate 10, and is thus excellent in mountability. Thus, chip component 20 can be mounted as a component with a measure against high frequency noise in a reduced time with a reduced cost.

According to circuit board 1 with a measure against high frequency noise according to the embodiment, ferrite is used for body 21 of chip component 20, and an absorptance of a magnetic field's energy at the chip component is high. Furthermore, according to circuit board 1 with a measure against high frequency noise according to the embodiment, when hexagonal ferrite is used for body 21 of chip component 20, a high frequency noise of a higher frequency band can be absorbed.

According to circuit board 1 with a measure against high frequency noise according to the embodiment, interconnect pattern 30 through which a high frequency noise conducts is provided on mounting surface 10a of interconnect substrate 10, and body 21 of chip component 20 is disposed on a portion of mounting surface 10a covering a portion of interconnect pattern 30, so that, by chip component 20 disposed immediately adjacent to interconnect pattern 30, a magnetic field's energy generated in a high frequency noise can be efficiently absorbed.

While the present disclosure has thus been described in an embodiment, the present disclosure is not limited to the above embodiment and is susceptible of a variety of variations. For example, while in the above embodiment body 21 of chip component 20 is formed using ferrite, a magnetic body other than ferrite is also applicable.

While in the above embodiment interconnect pattern 30 through which a high frequency noise conducts is provided with a pair of lands 40 and 41 integrally, the pair of lands 40 and 41 may not be connected to interconnect pattern 30. Even in this configuration, by the ferrite of body 21 of chip component 20, a magnetic field's energy generated by a high frequency noise can be absorbed, and the high frequency noise's conduction and reflection can be suppressed.

While in the above embodiment one chip component 20 which is a component with a measure against high frequency noise is provided on interconnect pattern 30, a plurality of chip components 20 may be provided. Thus, by providing a plurality of chip components 20, a portion covering interconnect pattern 30 with ferrite is increased, and a magnetic field's energy can be more absorbed.

Figure 5A:
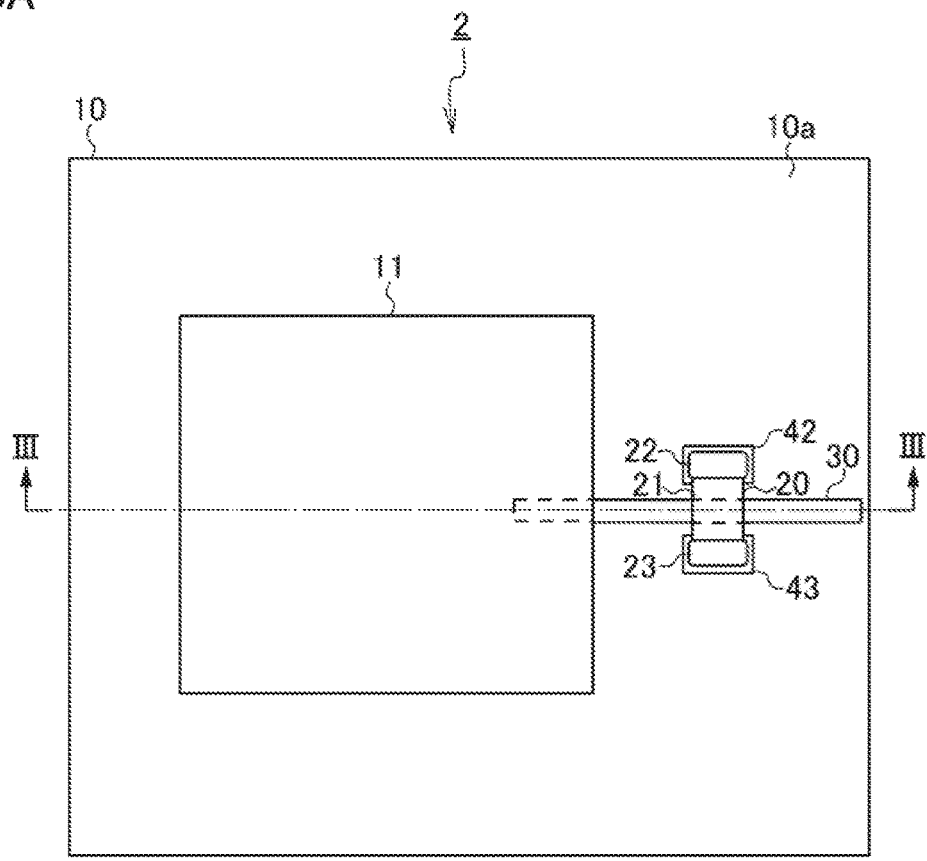
FIG. 5A and FIG. 5B show another exemplary arrangement of the chip component according to an embodiment.
Figure 5B:
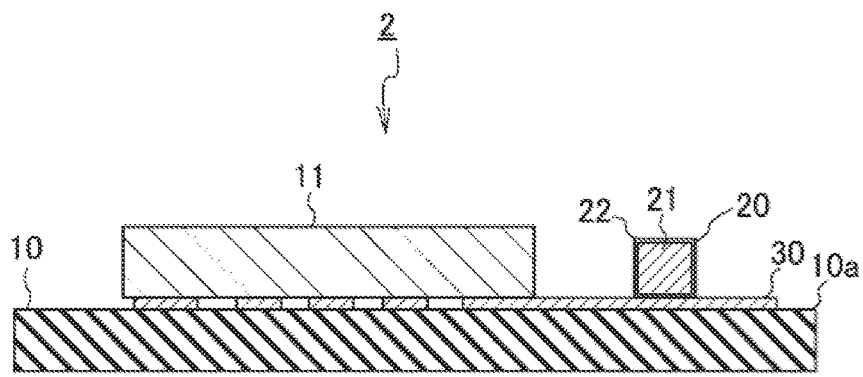

While in the above embodiment chip component 20 which is a component with a measure against high frequency noise is disposed parallel to the direction of interconnect pattern 30 through which a high frequency noise conducts, chip component 20 may be disposed (to have a longitudinal direction) across the direction of interconnect pattern 30. For example, with reference to FIG. 5A and FIG. 5B, an example of disposing chip component 20 in a different direction will be described. FIG. 5A and FIG. 5B show another exemplary arrangement of chip component 20 according to an embodiment, and FIG. 5A is a plan view and FIG. 5B is a cross section taken along a line III-III shown in FIG. 5A. In a circuit board 2 with a measure against high frequency noise shown in FIG. 5A and FIG. 5B, a pair of lands 42 and 43 is provided on mounting surface 10a of interconnect substrate 10, and the pair of lands 42 and 43 is disposed with interconnect pattern 30 interposed therebetween. Chip component 20 has one external electrode 22 connected to one land 42. Furthermore, chip component 20 has the other external electrode 23 connected to the other land 43. Thus, chip component 20 is mounted on interconnect substrate 10 and disposed across (i.e., to be substantially orthogonal to) interconnect pattern 30. In the case of circuit board 2 with a measure against high frequency noise, a magnetic field (a magnetic flux) caused by a high frequency noise conducting through interconnect pattern 30 is not interrupted by lands 42 and 43 (a metal object), and an absorptance of the magnetic field's energy at chip component 20 is high.

Figure 6A:
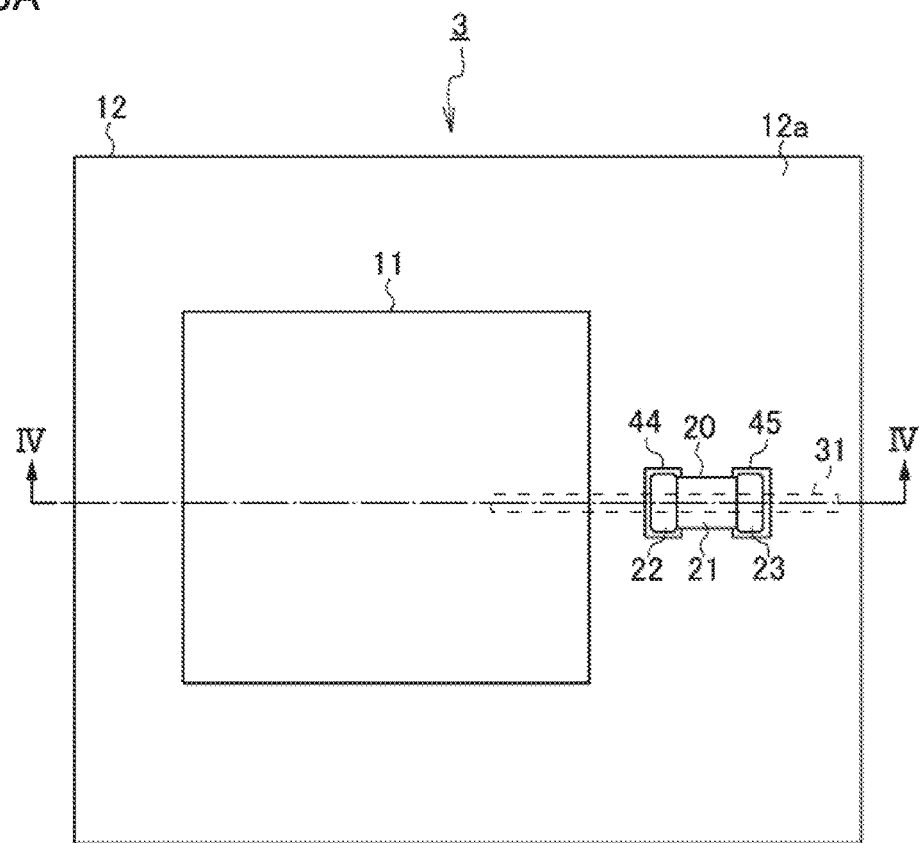
FIG. 6A and FIG. 6B show a configuration when an interconnect pattern according to an embodiment is disposed inside an interconnect substrate.
Figure 6B:
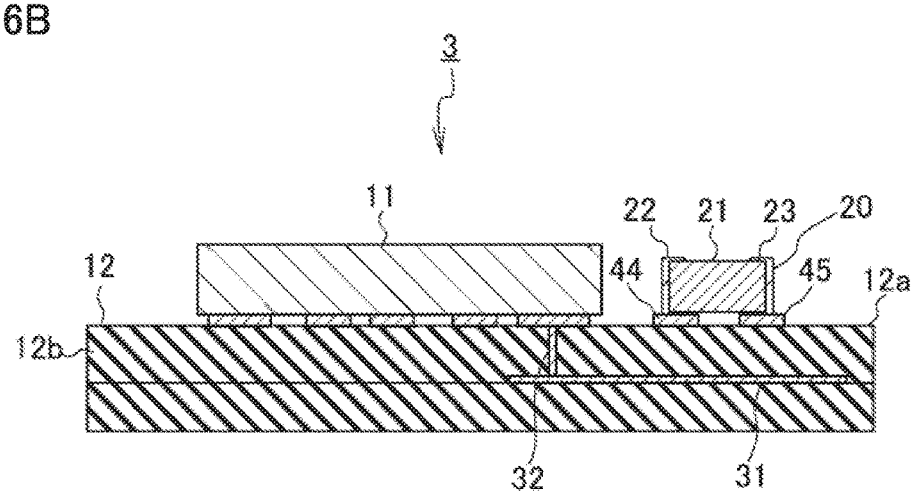

While in the above embodiment interconnect pattern 30 through which a high frequency noise conducts is provided on mounting surface 10a of interconnect substrate 10 (i.e., a surface of a substrate) and chip component 20 is mounted on mounting surface 10a, the present disclosure is also applicable to a case in which the interconnect pattern is provided in an interior of the substrate. For example, with reference to FIG. 6A and FIG. 6B, an example in which an interconnect pattern 31 is provided in an interior of an interconnect substrate 12 will be described. FIG. 6A and FIG. 6B show a configuration when interconnect pattern 31 according to an embodiment is disposed in an interior of interconnect substrate 12, and FIG. 6A is a plan view and FIG. 6B is a cross section taken along a line IV-IV shown in FIG. 6A.

In the case of a circuit board 3 with a measure against high frequency noise, interconnect pattern 31 through which a high frequency noise conducts is provided in an interior of interconnect substrate 12 (a multilayer interconnect substrate). IC 11 is electrically connected to interconnect pattern 31 via an interlayer penetrating via 32 formed to penetrate an insulating layer 12b in a thickness direction. Lands 44 and 45 are provided on a mounting surface 12a of interconnect substrate 12 and disposed over interconnect pattern 31 in a direction perpendicular to mounting surface 12a. Between lands 44, 45 and interconnect pattern 31, only insulating layer 12b exists, and lands 44, 45 are disposed at a location free of a metal object (e.g., a ground pattern) between the lands and interconnect pattern 31. Chip component 20 has one external electrode 22 connected to one land 44. Furthermore, chip component 20 has the other external electrode 23 connected to the other land 45.

Thus, chip component 20 is mounted on interconnect substrate 12 and disposed over interconnect pattern 31 with insulating layer 12b interposed, and also parallel to interconnect pattern 31. In the case of circuit board 3 with a measure against high frequency noise, by body 21 (i.e., ferrite) of chip component 20, a magnetic field's energy generated by a high frequency noise conducting through interconnect pattern 31 provided inside a substrate can be absorbed, and the high frequency noise's conduction and reflection at interconnect pattern 31 provided inside the substrate can be suppressed. Note, however, that this is applicable to a case in which chip component 20 (body 21) is present in a magnetic field generated with interconnect pattern 31 serving as a center. Note that while in the example shown in FIG. 6A and FIG. 6B chip component 20 is disposed parallel to interconnect pattern 31 provided inside a substrate, chip component 20 may be disposed across interconnect pattern 31.

While the present disclosure has been described in embodiments, it should be understood that the embodiments disclosed herein are illustrative and non-restrictive in any respect. The scope of the present disclosure is defined by the terms of the claims, and is intended to include any modifications within the meaning and scope equivalent to the terms of the claims.

What is claimed is:

1. A circuit board with a measure against high frequency noise comprising:
   an interconnect substrate having an interconnect pattern to which an integrated circuit is electrically connected;
   a pair of lands provided on a mounting surface of the interconnect substrate; and
   a chip component having a body composed of a magnetic body in a rectangular parallelepiped, and a pair of external electrodes provided at opposite ends of the body,
   the pair of external electrodes being connected to the pair of lands,
   inside the body, no conductor pattern being formed,
   the body being disposed on the interconnect pattern, as observed in a direction perpendicular to the mounting surface.

2. The circuit board with a measure against high frequency noise according to claim 1, wherein the magnetic body is ferrite.

3. The circuit board with a measure against high frequency noise according to claim 2, wherein the ferrite is hexagonal ferrite.

4. The circuit board with a measure against high frequency noise according to claim 1, wherein:
   the interconnect pattern is provided on the mounting surface; and
   the body is disposed at a location covering a portion of the interconnect pattern.

5. The circuit board with a measure against high frequency noise according to claim 4, wherein the interconnect pattern is connected to the lands.

6. The circuit board with a measure against high frequency noise according to claim 1, wherein:
   the interconnect substrate is a multilayer interconnect substrate;
   the interconnect pattern is provided in an interior of the interconnect substrate; and
   the body is disposed over the interconnect pattern provided in the interior.

7. The circuit board with a measure against high frequency noise according to claim 1, wherein the lands are not connected to the interconnect pattern.

* * * * *